United States Patent [19]

Paul

[11] Patent Number: 4,780,895
[45] Date of Patent: Oct. 25, 1988

[54] CIRCUIT FOR STABILIZING THE RATE AT WHICH PULSES APPEAR

[75] Inventor: Philippe Paul, Ploubezre, France
[73] Assignee: Alcatel Cit, Paris, France
[21] Appl. No.: 63,940
[22] Filed: Jun. 19, 1987

[30] Foreign Application Priority Data

Jun. 19, 1986 [FR] France .................................. 8608859

[51] Int. Cl.⁴ .............................................. H03K 5/26
[52] U.S. Cl. ..................................... 377/39; 328/134; 328/155; 307/527
[58] Field of Search .................. 377/39; 328/155, 134; 307/527

[56] References Cited

U.S. PATENT DOCUMENTS

| | | | |
|---|---|---|---|
| 3,164,777 | 5/1985 | Guanella | 328/134 |
| 3,720,910 | 3/1973 | McLaughlin et al. | 377/39 |
| 4,089,060 | 5/1978 | Mitchell | 377/39 |
| 4,345,211 | 8/1982 | Longworth | 328/155 |
| 4,606,058 | 8/1986 | Kruger et al. | 377/39 |
| 4,628,269 | 12/1986 | Hunninghaus et al. | 307/527 |
| 4,639,680 | 1/1987 | Nelson | 328/134 |

OTHER PUBLICATIONS

IBM Technical Bulletin, "Cycle-Synchronized Phase--Locked Loop, vol. 23, No. 1, pp. 81-82, Carnes & Weythman.

Primary Examiner—John S. Heyman
Attorney, Agent, or Firm—Sughrue, Mion, Zinn, Macpeak & Seas

[57] ABSTRACT

The circuit comprises two counters, one of which (A) operates at the irregular rate of asynchronous pulses applied to its count input (2), the other of which (B) operates at a regular rate which is not less than the average admissible rate for the asynchronous pulses, being clocked by an oscillator (5) providing pulses at a stable rate, a comparator (6) inhibiting the oscillator (5) each time the counter (B) catches up the counter (A) and a catch-up preventing control logic circuit (9) inhibiting the counter (A) whenever it tends to catch up the counter (B).

3 Claims, 1 Drawing Sheet

CIRCUIT FOR STABILIZING THE RATE AT WHICH PULSES APPEAR

The present invention relates to electronics, and in particular to counting the errors detected on a digital transmission line for the purpose of establishing the transmission error rate.

BACKGROUND OF THE INVENTION

The transmission quality of a digital link is monitored by measuring the error rate, i.e. the number of errors shown up by line code violations relative to the number of bits transmitted. Line code violations are normally very widely spaced apart, but they may appear in bursts: they are indicted by very short duration pulses whose duration is of the same order of magnitude as the duration of one bit (from a few tens of nanoseconds (ns) to 1 ns or less) and they need to be counted periodically.

In practice, such counting is performed by microprocessor circuits which are adapted to the average rate of error appearance corresponding to the maximum error rate which it is desired to measure, but which are too slow to react to the very short durations of the pulses themselves and which are therefore preceded by pulse widening circuits which suffer from the drawback of combining those pulses which are separated by an interval which is less than the duration of one widened pulse, and as a result only a single error is observed when several errors occur very close together.

Preferred implementations of the present invention replace the pulse widening circuits by a circuit which avoids the above-mentioned drawback while using only a minimum of highspeed technology circuits in order keep costs and power consumption down.

SUMMARY OF THE INVENTION

The present invention provides a circuit for stabilizing the rate at which asynchronous pulses appear, said circuit being based on two counters, one of which runs at the irregular rate at which asynchronous pulses appear and the other of which runs at a regular rate which is not less than the average admissible rate for the asynchronous pulses and which is associated with a pulse tracking logic circuit. Said circuit for stabilizing the rate of appearance of pulses comprising a first pulse counter of the asynchronous type provided with a count input receiving the asynchronous pulses, an inhibit input, and parallel outputs, and having initial stages with an operating speed which is compatible with the maximum frequency at which the asynchronous pulses may succeed one another;

an oscillator provided with an inhibit input, and delivering pulses at a stable rate at its output;

a second pulse counter provided with parallel outputs and with a count input receiving pulses from the oscillator;

a comparator having its comparison inputs connected to outputs of equal significance from the two counters and having an equality detection output connected to the inhibit input of the oscillator, said comparator inhibiting the oscillator in the event of the counts in the two counters being equal; and a catch-up preventing control logic circuit controlled by the outputs from the two counters and acting on the inhibit input of the first counter in such a manner as to inhibit said first counter when it is in danger of catching up the second counter.

In a preferred embodiment, both counters have a capacity equal to $2^N-1$, where N is an integer greater than 1, and the catch-up preventing control logic circuit comprises a first bistable held at rest by a logic 1 level on the output of significance $2^N-1$ of the second counter and put into operation by a transition from logic level 1 to logic level 0 of the output of significance $2^N-1$ of the first counter in order to generate an inhibit signal for said first counter, and a second bistable which is held at rest by a logic level 0 state on the output of significance $2^N-1$ of the second counter and put into operation by a transition from logic level 0 to logic level 1 on the output of significance $2^N-1$ of the first counter in order to generate an inhibit signal for said first counter.

BRIEF DESCRIPTION OF THE DRAWING

An embodiment of the invention is described by way of example, with reference to the accompanying drawing, in which.

MORE DETAILED DESCRIPTION

Figure 1:
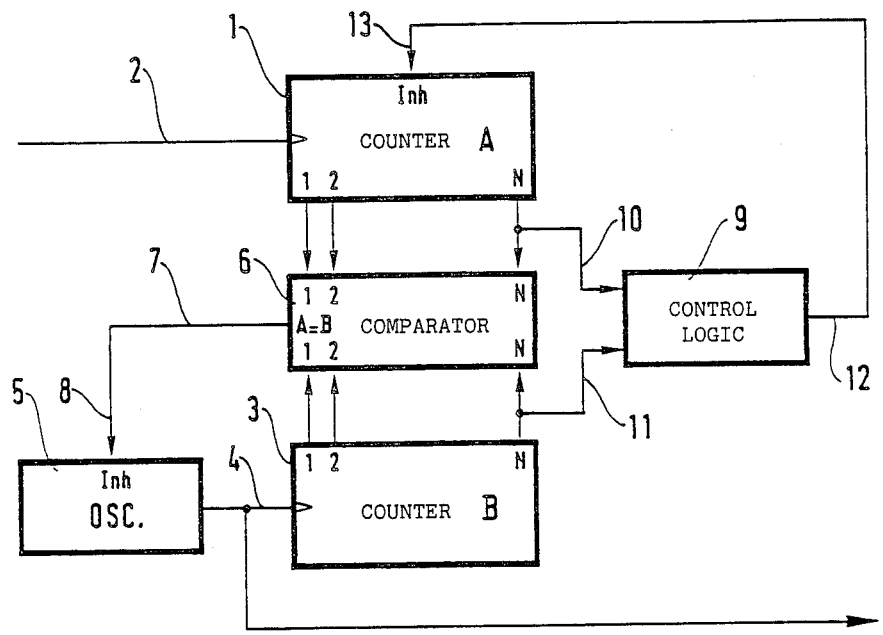
FIG. 1 is a block diagram of a circuit in accordance with the invention.

The circuit shown in FIG. 1 comprises: a first counter A referenced by the digit 1 and receiving a sequence of asynchronous pulses on its count input 2 for the purpose of stabilizing the rate thereof; a second counter B referenced by the digit 3 having its count input 4 connected to receive output pulses from an oscillator 5 operating at a chosen stable rate which is not less than the admissible average rate for asynchronous pulse appearance; a comparator 6 having its inputs connected to equal significance outputs 1, 2, ..., N of the counters A and B, and having its equality detection output 7 connected to an inhibit input 8 of the oscillator 5; and a catch-up preventing control logic circuit having inputs 10 and 11 connected to the most significant outputs from the counters A and B and having its own output 12 connected to an inhibit input 13 of the counter A.

The first counter A is of the asynchronous type. Only its initial stages which must have an operating speed compatible with the maximum succession frequency of the asynchronous pulses may need be made of highspeed technology. The counter A has a capacity of $2^N-1$, where N an integer greater than 1, and it is incremented at the irregular rate at which the asynchronous pulses appear. When switched on, it is initialized to zero by a control signal (not shown).

The second counter B has the same capacity $2^N-1$ as the first counter A and increments regularly at the rate of the oscillator 5 in order to track the value in the counter A without overtaking it since the oscillator 5 is inhibited by the comparator 6 each time the comparator detects that the count values in the two counters are equal. When switched on, this counter is likewise initialized to zero by a control signal (not shown).

The control logic circuit acts in the event of the circuit as a whole becoming saturated because the first counter A is tending to catch up with the second counter B. This kind of catching up occurs when the number of asynchronous pulses exceeds the number of pulses provided by the oscillator 5 by $2^N$, or by a multiple of $2^N$. If such catching up is allowed to take place, then each time it happens there is an abrupt error of $2^N$ in the number of pulses counted at the output from the circuit. In order to avoid this drawback, the control logic circuit temporarily inhibits the first counter A whenever it tends to come too close to the second counter B, thereby providing a saturation alarm while giving rise to an error in the number of output pulses which increase only gradually, and which stops increasing as soon as the saturation phenomenon disappears.

Figure 2:
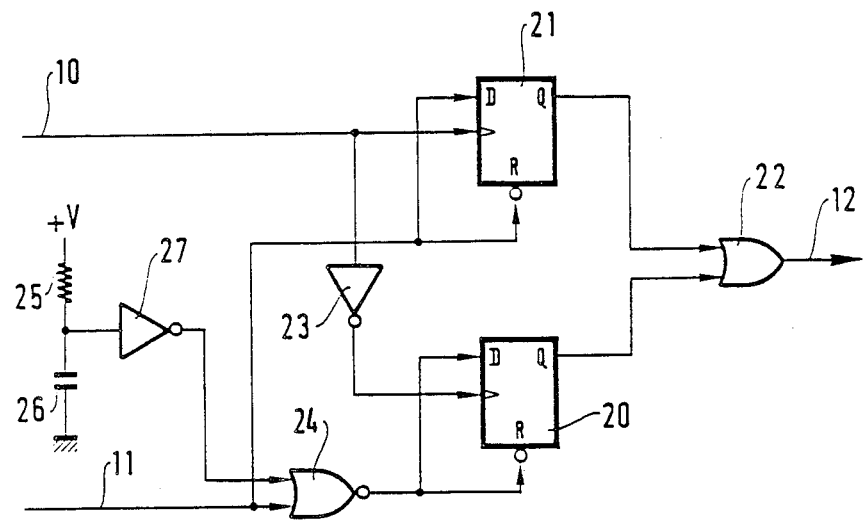
FIG. 2 shows details of the catch-up preventing logic circuit of FIG. 1.

An implementation of the control logic circuit is shown in FIG. 2. It is provided for a first counter A whose inhibit control is active at logic level 1, and it provides an inhibit instruction to the first counter A either when said counter reaches 0 modulo $2^N$ while the second counter B is in a count state lying in the range 0 to $2^{N-1}-1$ modulo $2^N$, or else when the first counter reaches $2^{N-1}$ modulo $2^N$ while the second counter B is in a count state lying in the range $2^{N-1}$ to $2^N-1$ modulo $2^N$. To do this, it comprises two D-type bistables 20 and 21 whose Q outputs are coupled to the output 12 from the control logic circuit via an OR-type logic gate 22.

These two D-type bistables have clock inputs which are sensitive to rising edges and have complemented reset to zero inputs. The first bistable 20 has its clock input connected via an inverter 23 and the input 10 to the control logic circuit to the output of significance $2^{N-1}$ of the first counter A, while its D input and its reset to zero input are connected via a NOR-type logic gate 24 and the input 11 of the control logic circuit to the output of significance $2^{N-1}$ of the second counter B. The second bistable 21 has its clock input connected via the input 10 of the control logic circuit to output of significance $2^{N-1}$ of the first counter A, and has it D input and its reset to zero input connected via the input 11 of the control logic circuit to the output of significance $2^{N-1}$ of the second counter B.

When the output of significance $2^{N-1}$ of the second counter B is at logic level 0, the counter B contains a count lying in the first half of its capacity. The second bistable 21 is inhibited while the first bistable 20 is active and may be triggered at any moment by the output of significance $2^{N-1}$ of the first counter A passing from logic level 1 to logic level 0, i.e. whenever the capacity of the first counter A overflows.

When the output of significance $2^{N-1}$ of the second counter B is at logic level 1, the counter B contains a count lying in the second half of its capacity. The first bistable 20 is inhibited and the second bistable 21 is active and may be triggered at any moment by the output of significance $2^{N-1}$ of the first counter A going from logic level 0 to logic level 1, i.e. whenever the counter A overflows one-half of its capacity.

In other words, the first bistable 20 generates an instruction for inhibiting the first counter A whenever the first counter reaches 0 modulo $2^N$, while the second counter B is in the first half of its capacity, with its count lying in the range 0 to $2^{N-1}-1$ modulo $2^N$, and this instruction is maintained until the counter B reaches $2^{N-1}$ modulo $2^N$, thereby removing said instruction. The second bistable 21 generates an inhibit instruction for the counter A whenever the counter A reaches $2^{N-1}$ modulo $2^N$ while the second counter B is in the second half of its capacity, with its count lying in the range $2^{N-1}$ to $2^N-1$ modulo $2^N$, and this instruction is maintained until the counter B reaches zero modulo $2^N$, thereby removing said instruction.

The logic NOR gate 24 has so far been described solely for the inverting function it provides relative to the input 11 while the circuit is in operation. Its second input serves to start up the control logic circuit when it is switched on. The second input of the NOR gate is connected to a switch-on circuit comprising an RC series circuit 25, 26 together with an inverting amplifier 27 which resets the first bistable 20 to 0, with the second bistable 21 being reset to 0 by the logic level 0 present on the output of significance $2^{N-1}$ of the second counter B which is initialized to zero when switched on.

It may be observed that the counters A and B are also initialized to zero on switch-on by said switch-on circuit by means of the output signal from the inverting amplifier 27 which is applied, via connections that are not shown, to the reset to zero inputs of said counters.

The scaling of the circuit, i.e. the capacity that needs to be given to the counters and the frequency which should be selected for the oscillator, depends on operating conditions. In the case mentioned in the introduction of counting line errors detected on a digital transmission path, there may be a requirement, for example, that detected errors should be countable in one second up to a rate of not less than $10^{-3}$, i.e. $10^{-3}$ times the line rate. In which case the frequency of the oscillator should be $10^{-3}$ times the line rate while the capacity of the counters should be equal to the number of cycles of the oscillator in one second, with the rate stabilizing circuit then serving to multiply the duration of error-indicating pulses by 1000, thus making them compatible with microprocessor processing speeds. Thus, for a conventional digital system operating at 140 Mbit/s using 5B/6B code giving a line rate of 168 Mbit/s, the counters could have a capacity of about $2^{18}$ and the oscillator could have a frequency of 168 Kbit/s which much more accessible to a microprocessor system than in the frequency of 168 MHz at which the error indicating pulses may follow one another.

Various dispositions may be modified and various means may be replaced by equivalent means without going beyond the scope of the invention.

I claim:

1. A circuit for stabilizing the rate at which asynchronous pulses appear, the circuit comprising:
  a first pulse counter of the asynchronous type provided with a count input receiving the asynchronous pulses, an inhibit input, and parallel outputs, and having initial stages with an operating speed compatible with the maximum frequency at which the asynchronous pulses succeed one another;
  an oscillator having an inhibit input and delivering output pulses at a stable rate;
  a second pulse counter provided with parallel outputs and with a count input receiving pulses from the oscillator;
  a comparator having comparison inputs connected to outputs of equal significance from the two counters and having an equality detection output connected to the inhibit input of the oscillator, said comparator inhibiting the oscillator in the event of the counts in the two counters being equal; and
  a catch-up preventing control logic circuit controlled by the outputs from the two counters and acting on the inhibit input of the first counter in such a manner as to inhibit said first counter when it is in danger of catching up the second counter.

2. A circuit according to claim 1 having two counters of capacity not less than $2^N-1$, where N is an integer greater than 1, wherein said catch-up preventing control logic circuit comprises first means for generating an inhibit instruction for the first counter when the first counter reaches 0 modulo $2^N$ while the second counter is in a count state lying in the range 0 to $2^{N-1}-1$ modulo $2^N$, and to remove this instruction only when the second counter reaches $2^{N-1}$ modulo $2^N$, and second means for generating an inhibit instruction for the first counter when the first counter reaches $2^{N-1}$ modulo $2^N$ while the second counter is in a count state lying in the range $2^{N-1}$ and $2^N-1$ modulo $2^N$, and for removing this instruction only when the second counter reaches 0 modulo $2^N$.

3. A circuit according to claim 2, wherein said first means comprise a first bistable held in the rest state by a logic level 1 on the output of significance $2^{N-1}$ of the second counter and triggered by a transition from logic level 1 to logic level 0 in the output of significance $2^{N-1}$ of the first counter, and in that said second means comprise a second bistable held at rest by a logic level 0 on the output of significance $2^{N-1}$ of the second counter and triggered by a transition from logic level 0 to logic level 1 in the output of significance $2^{N-1}$ of the first counter.

* * * * *